Nov. 4, 1958 W. R. KEARNEY ET AL 2,858,715

SOLENOID DRIVEN TUNER WITH MANUAL DRIVE

Filed Jan. 8, 1954 3 Sheets-Sheet 1

INVENTORS
William R. Kearney,
Bertram A. Schwarz &
BY Manfred G. Wright
R. E. Fowler
ATTORNEY Nov. 4, 1958 W. R. KEARNEY ET AL 2,858,715

SOLENOID DRIVEN TUNER WITH MANUAL DRIVE

Filed Jan. 8, 1954 3 Sheets-Sheet 2

INVENTORS
William R. Kearney,
Bertram A. Schwarz &
BY Manfred G. Wright
R. C. Fowler
ATTORNEY

SOLENOID DRIVEN TUNER WITH MANUAL DRIVE

Filed Jan. 8, 1954 3 Sheets-Sheet 3

INVENTORS
William R. Kearney,
Bertram C. Schwarz &
BY Manfred G. Wright
R. E. Fowler
ATTORNEY United States Patent Office 2,858,715

Patented Nov. 4, 1958

2,858,715

SOLENOID DRIVEN TUNER WITH MANUAL DRIVE

William R. Kearney, Bertram A. Schwarz, and Manfred G. Wright, Kokomo, Ind., assignors to General Motors Corporation, Detroit, Mich., a corporation of Delaware Application January 8, 1954, Serial No. 402,884

7 Claims. (Cl. 74—10)

This invention relates to tuning means for radio receiving apparatus and more particularly to combined automatic and manual means for tuning radio apparatus over the frequency band for which it is designed.

Radio broadcast receivers have been utilized of the "signal seeking" or "stop-on-signal" type in which means are provided to drive the tuning means across the frequency band. Indexing or stopping means actuated upon receipt of an incoming carrier wave stops the tuning means for reception on that signal frequency. Various driving means have been employed for moving the tuning means such as small motors or loaded spring means. In the present instance, as an example of various devices, a solenoid is used to drive the tuning means. This solenoid, in the interest of conservation of space and unit size, is of relatively short stroke, so that it is incapable of moving the tuning means entirely across its tuning band in the length on one solenoid stroke. Several strokes are necessary to provide adequate travel. The tuner is returned to the opposite limit of movement by a spring. Such a signal tuning mechanism is disclosed in copending Serial No. 273,730, filed February 27, 1952, in the name of Bertram A. Schwarz, entitled Solenoid Powered Tuner, which issued June 19, 1956 as U. S. Patent 2,751,-503 assigned to a common assignee.

It is desirable, however, to provide manual means to adjust the tuning means to any station in the band by hand in addition to said automatic tuning and indexing means.

It is therefore an object in making this invention to provide a combination signal controlled indexing means and manual tuning means for radio receiving apparatus.

It is a further object in making this invention to provide manual tuning means for a radio receiver which augments a signal tuned automatic indexing means.

It is a still further object in making this invention to provide manual tuning means coupled into the automatic signal control indexing means for adjusting the tuner.

With these and other objects in view which will become apparent as the specification proceeds, our invention will be best understood by reference to the following specification and claims and the illustrations in the accompanying drawings, in which:

Figure 2:
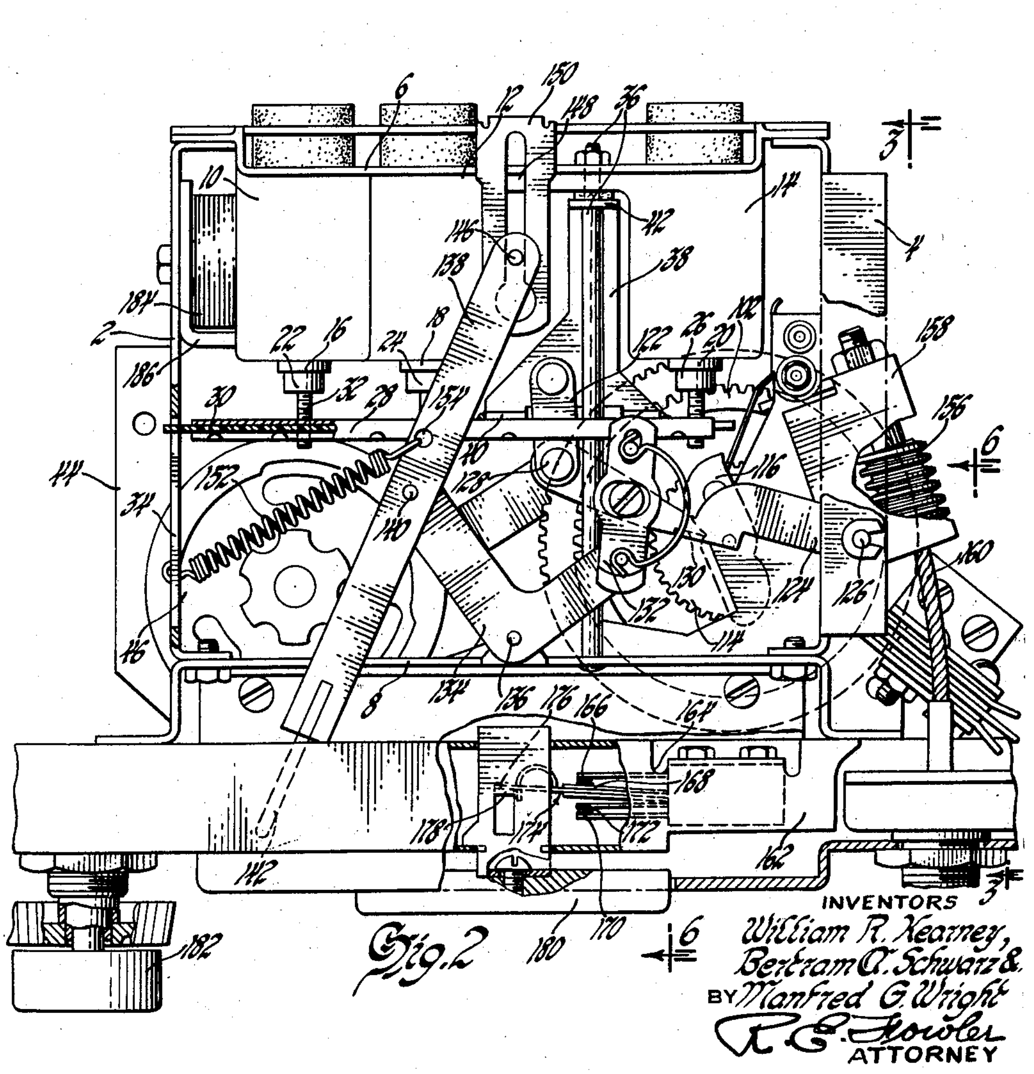
Figure 2 is a top plan view of the tuning means embodying our invention.

Referring now more specifically to the drawings, there is shown in Figure 2 a main frame for supporting the tuning and operating means, which frame consists of left-hand side member 2, right-hand side member 4, a transverse rear member 6, and a spaced transverse front member 8. These four members, suitably secured together at each of the corner junctions, form a substantial square box-like frame within which the tuning means and the operating means therefor are mounted. The rear transverse member 6 carries integral shielding members 10, 12 and 14, which in this instance are cylindrical can-type housings which are adapted to surround the inductance tuning coils. These coils are shown at 16, 18 and 20 respectively. The tuning of the receiver is accomplished by varying the inductances of these coils which are electrically connected into the different radio circuits by the insertion or withdrawing of associated comminuted iron cores 22, 24 and 26, all of which are adjustably mounted on a single transverse movable bar 28 so that they are simultaneously moved with respect to their associated coils for tuning purposes.

The transverse bar 28 has a separate strip of insulating material 30 secured to one face thereof through which openings are provided into which the threaded portions 32 of the core assemblies are screwed for support and adjustment. The end of the insulating strip 30 projects beyond the bar 28 and enters an elongated slot 34 in the side frame member 2 to act as a guide for the left-hand side of the bar as it reciprocates. A rod 36 extends from the rear transverse member 6 to the front transverse member 8 and also projects through an opening in the side of the bar 28 so that it acts as a track for the bar. To the rear face of the bar 28 there is secured an angled frame member 38 having two spaced upstanding flanges 40 which are rigidly secured to the rear face of the bar 28 by any suitable means, and a rearwardly extending portion terminating in a spaced upstanding flange 42 having an opening through which the rod 36 extends. This angled member 38 and its associated and rigidly connected bar 28 form a reciprocating carriage moving on the rod 36 and guided by the projecting end of the insulating strip 30 in slot 34.

A lower panel 44 covers the major portion of the bottom of the frame and is rigidly secured thereto and supports a driving solenoid 46. This solenoid is of the rotary type, moving short arcuate distances at each energization. The shaft 48 of the solenoid has secured to its lower extremity a radial arm 50 to which is pivotally connected a link 52. Also pivotally mounted on the lower panel 44 is a sector gear 54 pivoted on pin 56. This sector gear is pivotally connected to the outer end of the link 52 at 58. Thus rotation of the shaft 48 of the solenoid will move the sector gear about its pivot 56. A coil spring 60, having one end secured to a projection 62 from the panel 44 has its opposite end hooked through an opening 64 in the sector gear to bias the latter in a counterclockwise direction, as viewed in Figure 4.

Figure 3:
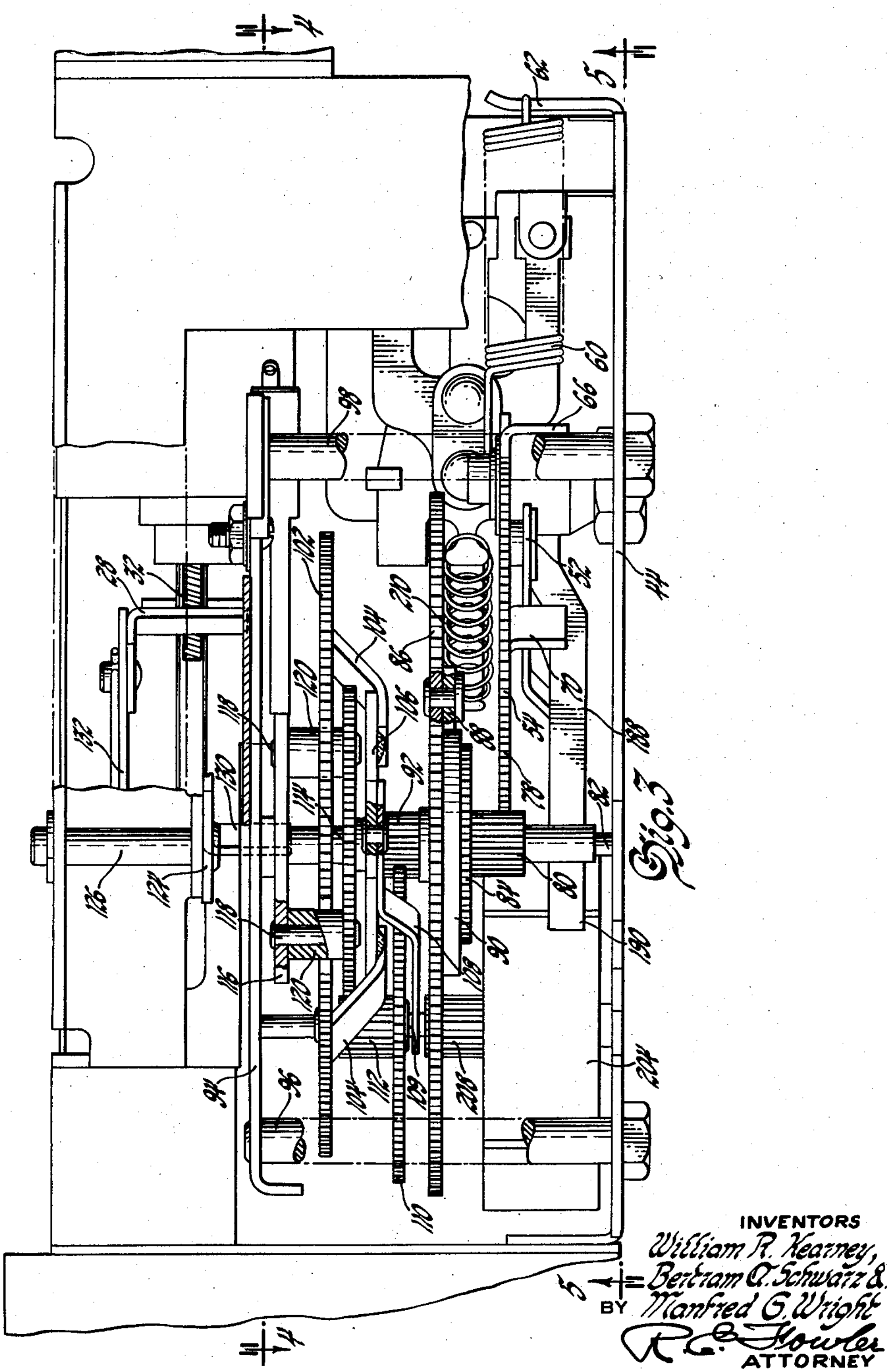
Figure 3 is an enlarged side view of the tuning means taken on the line 3—3 of Figure 2.
Figure 5:
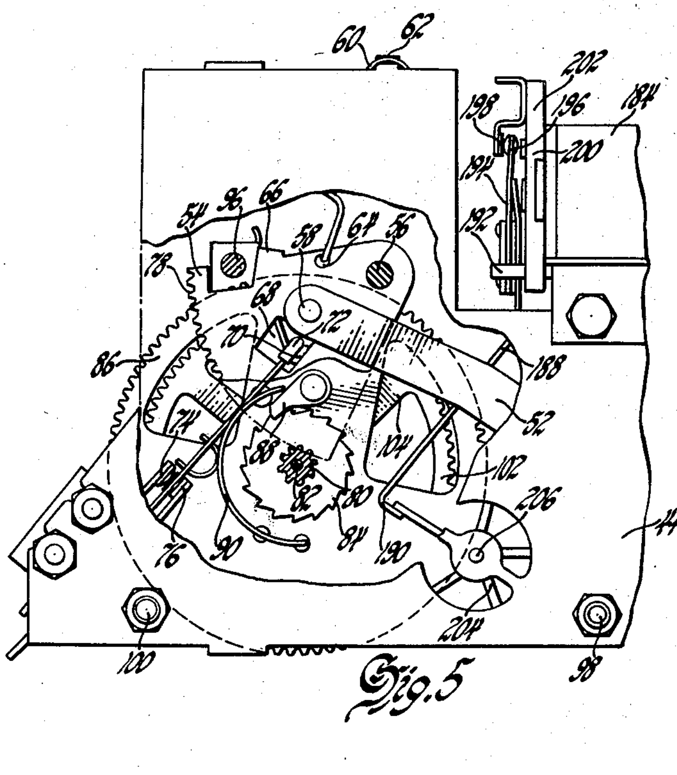
Figure 5 is a partial bottom view with parts broken away and shown in section taken on line 5—5 of Figure 3.
Figure 6:
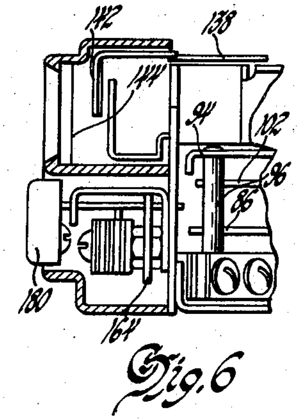
Figure 6 is a sectional view taken on the line 6—6 of Figure 2.

A tang 66 is bent downwardly from one edge of the sector gear and an opening 68 is punched out of the central portion of the sector gear and a second spaced tang 70 bent downwardly from this area. These two spaced tangs are adapted to engage the end 72 of a switch operating arm which snaps over center to engage either of two fixed contacts 74 and 76 for purposes to be described. The teeth 78 on the edge of the sector gear 54 are adapted to engage with a pinion 80 (Figure 3) loosely mounted for rotation on shaft 82, rotatably supported by lower plate 44. Rigidly secured to pinion 80 to rotate therewith is a ratchet wheel 84. Fixedly secured to the shaft 82 to rotate therewith is a large gear 86 which lies adjacent the ratchet wheel 84. On the under surface of the gear 86, as shown in Figures 3 and 5, there is pivotally attached a pawl 88 having its point adapted to engage the teeth of the ratchet wheel 84. This pawl is spring-biased toward the teeth by a long arcuate spring arm 90 having one end secured to the under surface of gear 86 and the opposite end engaging the outer surface of the pawl 88. Thus, when the sector gear 78 drives the pinion 80 to in turn rotate the ratchet wheel 84, the gear 86 will be driven through the pawl and ratchet connection. However, when the sector gear rotates in the opposite direction, at which time the solenoid returns to a position of rest, the pawl 88 will ratchet over the teeth of the ratchet wheel 84 and the gear 86 will remain stationary.

Rigidly secured to the shaft 82 above the gear 86 is another pinion 92 which is thus driven by rotation of the gear 86. The upper end of the shaft 82 is rotatably mounted in an upper plate 94 which is supported parallel to the lower plate 44 by suitable supporting means such as pillars 96, 98 and 100. A large gear wheel 102 is rotatably mounted on the upper end of shaft 82. This wheel has a plurality of radially extending dished arms 104 at arcuately spaced positions which support a platform 106 through which the shaft 82 projects. To the under side of this platform 106 there is secured an offset arcuate strip 108 upon the center portion of which a gear 110 is rotatably mounted. The two ends of the strip 108 are riveted to the platform 106 on opposite sides of the shaft 82. The gear 110, rotatably mounted on a stub shaft 109 on said strip, meshes with the pinion 92, and is driven thereby.

Rigidly connected to said gear 110 to rotate therewith is a pinion 112 mounted on the same short stub shaft. In the depressed portion of the gear 102 there is loosely mounted on shaft 82 a small gear 114 which meshes with the pinion 112 and carries in spaced relation to its upper surface a cam member 116. This cam member 116 is secured to the gear 114 by pins 118 and spaced therefrom by spools 120 on the pins between the two members. Thus, as the pinion 92 is driven by the sector gear 78, the gear 114 would be rotated to turn the irregularly shaped cam member 116 for purposes to be described.

Figure 4:
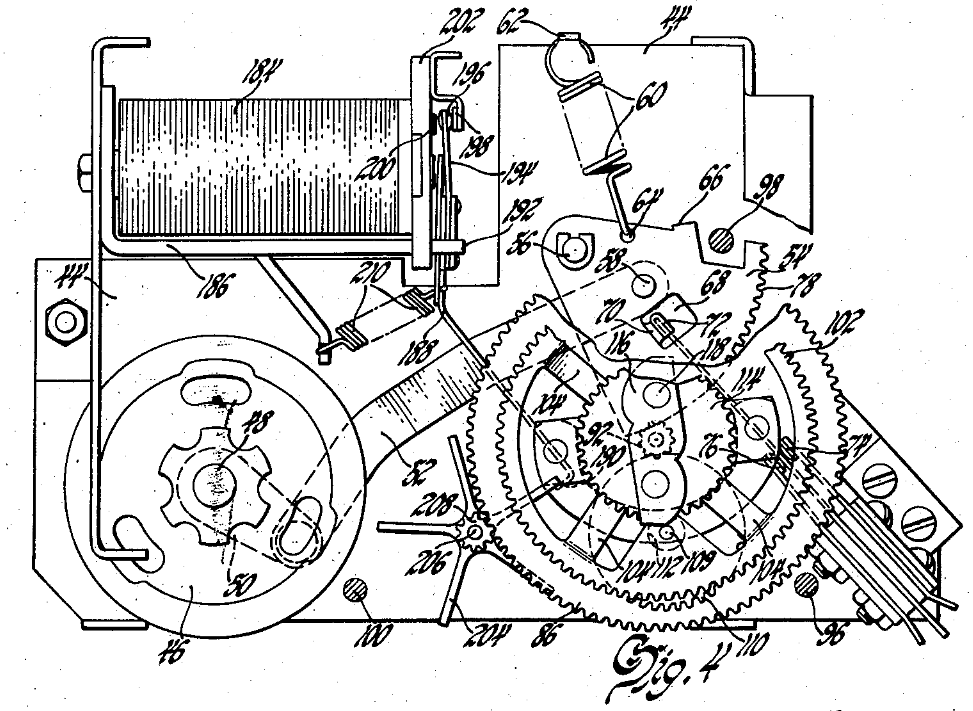
Figure 4 is a reduced sectional view taken on the line 4—4 of Figure 3.

The configuration of the cam shaped member 116 is best shown in Figure 4. The reciprocating carriage previously described, which carries the tuning cores 22, 24 and 26, has pivotally connected to the top of frame 38 a short link 122. A driving arm 124, pivotally mounted around stationary pivot 126 on frame member 4, is pivotally connected to the opposite end of the short link 122 at 128. The arm 124 has a downwardly extending cam follower 130 integral therewith which follows the side surfaces of the cam 116 as it is rotated with the gear 114. The engagement of the cam 116 with this member 130 causes the driving arm 124 to move forward about the stationary pivot 126, and this causes the tuning carriage to move forward, withdrawing the cores from the coils and tuning the receiver over the band.

Figure 1:
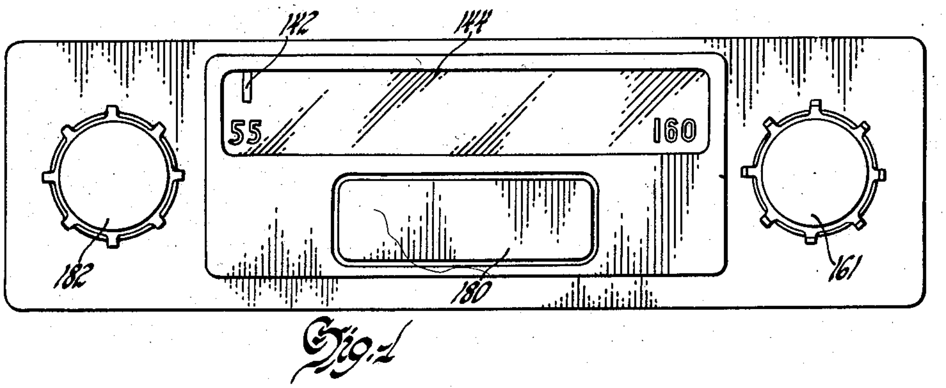
Figure 1 is a front elevation of a radio receiver embodying our invention.

Pivotally secured to the top of the right-hand end of the bar 28, as viewed in Figure 2, is a link system 132, the opposite end of which is pivotally connected to one arm of a bell crank 134 in turn pivoted at 136 on the front frame member 8. The other arm of the bell crank is pivotally connected to an elongated indicating arm 138 at point 140. The indicating arm 138 extends to the front of the tuning mechanism and carries an indicating needle 142 adapted to move over a dial 144, as shown in Figure 1. The rear portion of the indicating arm 138 has a vertically disposed rivet 146 extending from its lower surface and riding in a slot 148 in a bracket 150, carried by the rear frame member 6. A coil spring 152 has one end anchored to side frame member 2 and the other hooked through an opening 154 in the indicating arm 138 to bias the mechanism toward the left, as shown in Figure 2. Thus, as the carriage moves forward, the link 132 causes the bell crank lever 134 to pivot in a clockwise direction about its pivot 136, moving the indicating needle 142 from left to right across the dial. It will be noted that the bias provided by spring 152 tends to rotate the bell crank 134 in a counterclockwise direction to therefore hold the cam arm 130 of the operating arm 124 against the surface of cam 116. The driving mechanism so far described is the power drive portion and through it the tuner is moved between the low frequency end of the band and the high frequency end through the driving effort provided by the reciprocating solenoid 46 and return spring 152.

Manual means are also provided for moving the tuning mechanism to set the receiver to any desired frequency. This means consists of a worm gear 156 which is rotatably mounted in a housing 158 rigidly supported on the upper plate 94. This worm is adapted to engage the teeth on worm wheel or gear 102 and to turn the same about shaft 82 when operated. A flexible drive shaft 160 is connected to the worm and extends through the front panel of the receiver, where a knob 161 is adapted to be secured thereto to rotate this shaft to turn the worm for manual tuning. The tuner is, of course, also provided with an off/on switch adapted to be operated by the knob 182 on the opposite side of the tuner.

The front frame member 8 carries a transverse member 162 which acts as a cover for a multiple contact switch carried by a flange 164, depending from the lower surface thereof. This switch consists of a relatively stationary contact 166 which is adapted to be engaged by a relatively movable contact 168 and a second spaced relatively stationary contact 170 which is adapted to be engaged by a relatively movable contact 172. Oscillating between these two pairs of contacts is a resilient arm 174 which is snapped back and forth from one position to the other by a snapover spring arm 176. The arm 174 remains in the last position to which it has been thrown until it is snapped in the opposite direction by movement of the spring arm 176. This latter arm is moved by a tang 178 which engages the end of the spring arm 176 and which is moved inwardly by pressure on a push-switch bar 180 mounted for reciprocation in the front of the tuner.

Since this tuner is of the signal seeking or signal tuned variety, means are provided to stop the movement of the tuning means upon the reception of a carrier signal in the receiver. The control relay coil for this purpose is shown at 184 where it is mounted on a bracket 186 secured to the lower plate 44. This relay coil actuates a compound movable armature consisting of a first angular arm 188 having its end bent at right angles to form a tip 190 and its opposite end passing under a retaining strap 192 which forms a pivot for the armature assembly. Secured to the first member 188 adjacent the pivot strap 192 is a contact carrying arm 194 having on its end a contact member 196. This member oscillates between two stationary contacts 198 carried by an angled bracket and a second stationary contact 200, both the bracket and the second stationary contact being carried by a plate 202 of insulating material which is in turn mounted on the end of the coil 184.

In order to govern and regulate the speed of travel of the tuner at the times when it is driven by the solenoid motor, the gear train through which the tuner is driven is provided with an air fan governor 204. This air fan governor is mounted on rotatable shaft 206 mounted for rotation in upper and lower plates 94 and 44. This same shaft 206 has mounted thereon a driving pinion 208 which meshes with the teeth of gear 86 and is driven by the rotation thereof. The pivoted armature 188 of the control relay is biased in a clockwise direction, as shown in Figure 4, by a coil spring 210, one end of which is anchored to the frame and the opposite end hooked over the arm 188. This spring bias causes the detent end 190 of the arm 188 to engage the ends of the vanes of the fly fan governor 204 to mechanically stop the same from rotation when the coil 184 is deenergized, but when the coil is energized it is lifted out of engagement therewith and the governor 204 permitted to rotate and the tuner moved.

The tuning apparatus operates in the following manner. It is assumed that the receiver is turned on and that the set is receiving signals from a certain broadcasting station. The listener may desire to tune in another station by the use of the automatic signal seeking control. He therefore pushes inwardly on switch 180, which forces arm 174 in to close switch contacts 170—172. This causes energization of the relay coil 184 through conventional signal seeking control circuits. Coil 184 attracts its armature 194—188 which pivots, removing the detent 190 from engagement with the blades of the fly fan 204. Simultaneously the driving solenoid 46 is energized, applying a rotative force to its shaft 48. This force is transmitted to the sector gear 54 through the coupling linkage 50—52 and causes the sector gear to rotate in a clockwise direction about its pivot 56 and against the bias of spring 60.

The teeth 78 of the sector gear drive pinion 80 which is free on shaft 82, and that in turn rotates the ratchet wheel 84. As the sector gear rotates in a counterclockwise direction, the point of the pawl 88 fits into the teeth of the ratchet wheel 84 and receives rotative force therefrom, thus causing rotation of the large gear 86. The rotation of the gear 86 causes rotation of the cam 116 through the following gears: pinion 92, rigidly secured to the gear 86, gear 110, pinion 112 connected thereto, and gear 114 rigidly attached to cam 116.

The surfaces of the cam 116 engage an arm 130 depending from pivoted lever 124, causing the lever to rotate in a counterclockwise direction about its pivot 126, as viewed in Figure 2, as the cam 116 rotates. This pulls forward the carriage, upon which the tuning cores are mounted, and thus tunes the receiver. As the cam 116 continues to rotate, the carriage is pulled further and further forward until it reaches its limit of forward travel, at which point the cam surface is so shaped as to provide a rapid return or drop-off point, which permits the carriage to return to its innermost position quickly under the influence of the biasing spring 152. The cam 116 contains a pair of similar surface configurations of the desired shape so that in one complete revolution of the gear 114 the carriage will be reciprocated twice through its travel.

The solenoid 46 in this instance, however, does not have sufficient movement through one energization to cause the tuner to move from its innermost to its outer extreme position, but rather such drive is provided through a plurality of short rapid strokes of the solenoid. Upon initial energization the shaft 48 of the driving solenoid will turn in the clockwise direction, as shown in Figure 4, pulling the sector gear 54 in the same direction. When, however, it has moved far enough to cause tang 66 on the sector gear to engage switch operating arm 72, the switches 74 and 76 connected in circuit with the solenoid will be operated to deenergize the solenoid and permit the biasing spring 60 to return the sector gear and solenoid to their deenergized positions. As the teeth 78 of the sector cause rotation of the pinion 80 in the opposite direction at this time, ratchet wheel 84 will also be rotated in that direction, but the pawl 88 will merely slip over the teeth and the remaining portions of the gear train will not be driven. As soon as the sector gear 54 is returned to its initial position, tang 70 will engage switch arm 72 and snap it over center and the switches 74 and 77 will be actuated in the opposite sense to again energize the solenoid 46 for driving. Thus the tuning means is driven from its innermost to its outermost position by repeated operations of the solenoid, and when it reaches its outermost position, the tuner is quickly returned to its innermost position by spring bias. During normal solenoid drive, if a station is encountered, relay 184 is deenergized and detent 190 drops into engagement with the blades of the fly fan governor 204 to index the tuning means on that station. If the operator is still not satisfied with the program, he again depresses the switch 180 and the tuner proceeds on to the next transmitting signal. No indexing is provided on the quick backstroke.

If at any time the operator desires to manually move the tuning means, he merely rotates the knob 161 in either direction, depending upon the location of the tuning means. The rotation of the knob 161 drives worm 156, which engages the teeth of worm wheel 102. Worm wheel 102 carries on an arcuate bracket, gear 110, and since the latter is rigidly connected to a pinion 112 engaging gear 114, the whole assembly including cam 116 rotates as a unit around pinion 92, which at this time is locked when the knob 161 is turned. The gear 86, rigidly connected to pinion 92, is locked through detent 190, preventing the fly fan governor 204 from turning. Thus whether the automatic system is used or not the operator can at any time manually move the tuner to any desired position. Through manual operation of the cam 116 the tuning carriage is, of course, adjusted back and forth in the same manner as it would be if the automatic drive were used for movement.

We have, therefore, provided an automatic tuning means for driving a tuner which is indexed upon the receipt of an incoming signal in combination with manual drive means which can be used at any time to adjust the carriage to a desired point for reception.

We claim:

1. In radio apparatus, adjustable tuning means, a carriage upon which the tuning means is mounted, a rotatable cam, means connected to the carriage engaging said cam to cause movement of the carriage as the cam rotates, motor driving means for the cam, a gear train interconnecting the motor drive means and the cam, detent locking means engaging a part of the gear train for indexing, and manually operable means connected to a part of the gear train to independently drive the cam when the train is locked by the indexing means.

2. In radio apparatus, adjustable tuning means, a reciprocable carriage upon which the tuning means is mounted, energizable driving means, gearing means including a one-way drive operatively interconnecting the driving means with the carriage so that the latter will be driven over its path, locking indexing means operably connected to the gearing means on the driven side of the one-way drive and manual means operatively connected to the gearing means on the carriage side of the one-way drive to independently move the carriage when the driving means is inactive.

3. In radio apparatus, adjustable tuning means, movable means upon which the tuning means is mounted, driving solenoid means, a rotatable member biased for rotation in one direction, means connecting the solenoid means and member to rotate the latter in a direction opposite to said bias, and gearing means operatively interconnecting said member and said movable means to drive the latter, said gearing means including a planetary portion and manual means connected to the planetary portion to independently move the same and thus the movable means when the solenoid is deenergized.

4. In radio apparatus, adjustable tuning means, movable means upon which the tuning means is mounted, driving solenoid means, a pivoted gear biased for rotation in one direction, means connecting the solenoid means and the gear to rotate the latter in a direction opposite to said bias, one-way drive means interconnecting the gear and the movable means to drive the movable means during solenoid energization periods and permit return of the solenoid means to its position of rest when deenergized, and manual drive means connected to said movable means to independently drive the movable means.

5. In radio apparatus, adjustable tuning means, movable means upon which the tuning means is mounted, a driving solenoid, a sector gear biased in one direction connected to the solenoid to be rotated thereby in a direction opposite to said bias, one-way drive means interconnecting the sector gear and the movable means to drive the movable means during solenoid energization periods and permit return of the solenoid to its position of rest when deenergized, locking indexing means contacting said one-way drive means to index the same and manual drive means connected to said movable means to independently drive the movable means.

6. In radio apparatus, adjustable tuning means for the apparatus, movable means upon which the tuning means is mounted, reciprocating solenoid driving means, a pivoted gear which is spring biased in one direction of rotation, linkage means interconnecting the solenoid driving means and the gear to rotate the latter in an opposite direction to the bias, gear train means engaging the gear and driven thereby including a planetary section, a cam connected to and driven by the opposite end of the gear train means to that engaging the pivoted gear, a cam follower on the movable means which engages the cam and is moved thereby, and manually operable means engaging the gearing means adjacent the cam to drive the gearing when the solenoid driving means is inactive and utilizing the planetary action.

7. In radio apparatus, adjustable tuning means for the apparatus, movable means upon which the tuning means is mounted, reciprocating solenoid driving means, a pivoted gear which is spring biased in one direction of rotation, linkage means interconnecting the solenoid driving means and the gear to rotate the latter in an opposite direction to the bias, gear train means engaging the gear and driven thereby including a planetary section and a one-way drive, a cam connected to and driven by the opposite end of the gear train means, a cam follower on the movable means carrying the tuning means which is operatively engageable with said cam to move the movable means when the cam is driven, manually driven means meshing with the gear train beyond the planetary section to drive that part at will, said one-way drive providing a continuous drive in one direction in the gear train means from the reciprocating solenoid driving means.

References Cited in the file of this patent

UNITED STATES PATENTS

| | | |
|---|---|---|
| 2,207,467 | Muller | July 9, 1940 |
| 2,411,754 | Pifer et al. | Nov. 26, 1946 |
| 2,494,235 | Gierwiatowski | Jan. 10, 1950 |
| 2,499,573 | Dunn | Mar. 7, 1950 |
| 2,511,580 | Goodrich, Jr. | June 13, 1950 |
| 2,511,602 | Sperber | June 13, 1950 |
| 2,512,714 | Carlzen | June 27, 1950 |
| 2,563,664 | Teaf et al. | Aug. 7, 1951 |
| 2,612,051 | Felt | Sept. 27, 1951 |
| 2,625,632 | Onia et al. | Jan. 13, 1953 |

UNITED STATES PATENT OFFICE

CERTIFICATE OF CORRECTION

Patent No. 2,858,715 November 4, 1958

William R. Kearney et al.

It is hereby certified that error appears in the printed specification of the above numbered patent requiring correction and that the said Letters Patent should read as corrected below.

Column 1, line 53, for "control" read -- controlled --; column 7, line 2, strike out "a"; line 3, beginning with "driving" strike out all to and including "in a" in line 4, and insert instead -- driving solenoid means, a pivoted gear biased for rotation in one direction, means connecting the solenoid means and the gear to rotate the latter in a --; line 6, before "gear" strike out "sector"; line 8, after "solenoid" insert -- means --.

Signed and sealed this 14th day of April 1959.

(SEAL)
Attest:

KARL H. AXLINE
Attesting Officer

ROBERT C. WATSON
Commissioner of Patents